(12) United States Patent
Nagafuchi et al.

(10) Patent No.: US 11,329,333 B2
(45) Date of Patent: May 10, 2022

(54) HEAT TRANSFER DEVICE, HEAT TRANSFER SYSTEM, AND ENERGY STORAGE MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Akihiro Nagafuchi, Mie (JP); Hideyuki Kuboki, Mie (JP); Eiichi Kobayashi, Osaka (JP); Souichirou Okumura, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 43 days.

(21) Appl. No.: 16/962,066

(22) PCT Filed: Jan. 18, 2019

(86) PCT No.: PCT/JP2019/001401
§ 371 (c)(1),
(2) Date: Jul. 14, 2020

(87) PCT Pub. No.: WO2019/142891
PCT Pub. Date: Jul. 25, 2019

(65) Prior Publication Data
US 2020/0350647 A1  Nov. 5, 2020

(30) Foreign Application Priority Data

Jan. 22, 2018  (JP) .............................. JP2018-008010

(51) Int. Cl.
*H01M 10/6557* (2014.01)
*H01M 10/613* (2014.01)
(Continued)

(52) U.S. Cl.
CPC ........ *H01M 10/6557* (2015.04); *F28D 15/02* (2013.01); *H01G 11/10* (2013.01);
(Continued)

(58) Field of Classification Search
CPC ........... H01M 10/6557; H01M 10/613; H01M 10/615; H01M 10/625; H01M 10/647; H01M 10/6569
See application file for complete search history.

(56) References Cited

U.S. PATENT DOCUMENTS

2006/0243427 A1  11/2006  Kitajima et al.
2014/0360701 A1  12/2014  Aoki et al.
(Continued)

FOREIGN PATENT DOCUMENTS

JP  63-148093  6/1988
JP  2006-308239  11/2006
(Continued)

OTHER PUBLICATIONS

International Search Report issued in International Patent Application No. PCT/JP2019/001401, dated Apr. 9, 2019 (with English translation).

*Primary Examiner* — Jimmy Vo
(74) *Attorney, Agent, or Firm* — Greenblum & Bernstein, P.L.C.

(57) ABSTRACT

The heat transfer device includes a sealed bag, a working fluid, and a contact component. The working fluid is enclosed in the bag. The contact component includes a first contact portion and a second contact portion that are separated from each other via a spacer. A left edge portion of the (Continued)

bag is disposed between the first contact portion and the second contact portion. The left edge portion contacts the first contact portion and the second contact portion when the bag expands due to vaporization of the working fluid.

9 Claims, 5 Drawing Sheets

(51) Int. Cl.
| | |
|---|---|
| *H01M 10/615* | (2014.01) |
| *H01M 10/625* | (2014.01) |
| *H01M 10/647* | (2014.01) |
| *H01M 10/6569* | (2014.01) |
| *F28D 15/02* | (2006.01) |
| *H01G 11/10* | (2013.01) |
| *H05K 7/20* | (2006.01) |
| *H01M 50/20* | (2021.01) |

(52) U.S. Cl.
CPC ....... *H01M 10/613* (2015.04); *H01M 10/615* (2015.04); *H01M 10/625* (2015.04); *H01M 10/647* (2015.04); *H01M 10/6569* (2015.04); *H01M 50/20* (2021.01); *H05K 7/209* (2013.01)

(56) References Cited

U.S. PATENT DOCUMENTS

2016/0099490 A1* 4/2016 Larsson ................. H01G 11/76
 429/120
2020/0075267 A1* 3/2020 Sawamura ............... H01G 2/04

FOREIGN PATENT DOCUMENTS

JP 2013-174376 9/2013
WO WO-2018097092 A1 * 5/2018 ........... F28D 1/0375

* cited by examiner

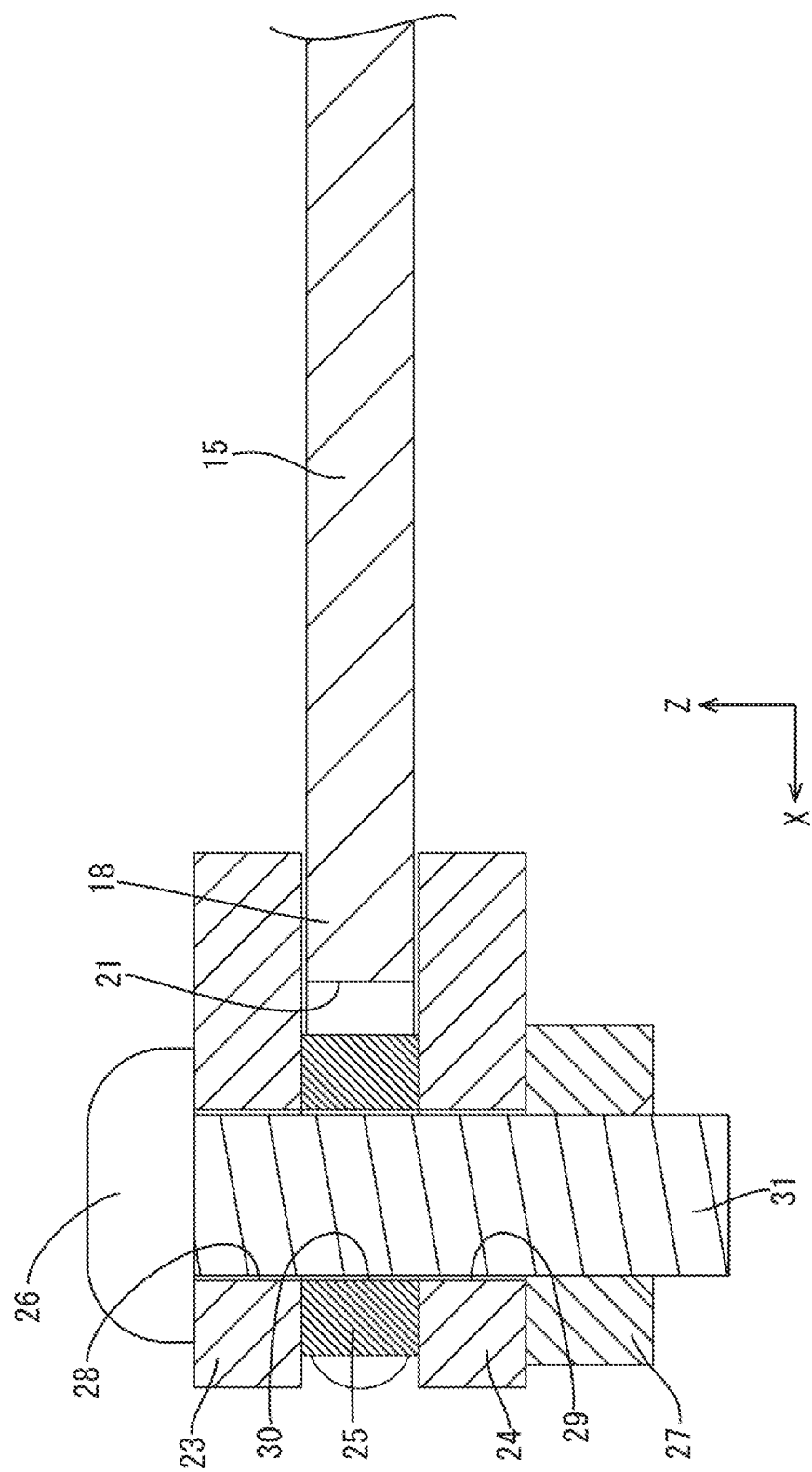

HEAT TRANSFER DEVICE, HEAT TRANSFER SYSTEM, AND ENERGY STORAGE MODULE

TECHNICAL FIELD

The technology described herein relates to a heat transfer device, a heat transfer system, and an energy storage module.

BACKGROUND ART

An example of a heat transfer device including a working fluid enclosed in an airtight enclosure having a bag shape is disclosed in Japanese Unexamined Patent Application Publication S63-148093. The airtight enclosure includes a vapor remaining portion for transferring heat from an object that is to be cooled down to the working fluid via the airtight enclosure that is in contact with the object. In the vapor remaining portion, the working fluid that has received the heat is vaporized. As a result, the working fluid changes its phase to a gas phase. At this time, the working fluid absorbs heat of vaporization.

The airtight enclosure includes a condensing portion that is other than the vapor remaining portion. The vaporized working fluid in the gas phase is condensed in the condensing portion. In the vaporizing portion, the working fluid releases the heat of vaporization absorbed during the vaporization. The heat is released to the outside of the heat transfer device via the airtight enclosure.

RELATED ART DOCUMENT

Patent Document

Patent Document 1

Japanese Unexamined Patent Application Publication S63-148093

SUMMARY OF THE INVENTION

Problem To Be Solved By The Invention

To improve the heat transfer efficiency of the heat transfer device, it is preferable that the heat is quickly transferred from the condensing portion of the airtight enclosure. Therefore, the condensing portion of the heat transfer device may be pressed against a heat receiving member to achieve close contact.

If the pressure to press the condensing portion against the heat receiving member is excessively large, a sufficient amount of the working fluid in the gas phase may not flow into an inner area of the condensing portion. This may cause insufficient heat transfer from the working fluid to the airtight enclosure in the condensing portion. As a result, the heat transfer efficiency of the heat transfer device may decrease.

If the pressure to press the condensing portion against the heat receiving member is not sufficient, the airtight enclosure may expand due to the vaporized working fluid flowing into the condensing portion, resulting in a decrease of contact area between the heat receiving member and the condensing portion of the airtight enclosure. This may cause insufficient heat transfer from the condensing portion of the airtight enclosure to the heat receiving member. As a result, the heat transfer efficiency of the heat transfer device may decrease.

The technology described herein was made in view of the above circumstances. An object is to provide a technology regarding a heat transfer device, a heat transfer system, and an energy storage module with improved heat transfer efficiency.

MEANS FOR SOLVING THE PROBLEM

A heat transfer device described herein includes a sealed bag, a working fluid, and a contact component. The working fluid is enclosed in the bag. The contact component includes a first contact portion and a second contact portion separated from each other via a spacer. At least one side edge portion of the bag is disposed between the first contact portion and the second contact portion. The at least one side edge portion contacts the first contact portion and the second contact portion when the bag expands due to vaporization of the working fluid.

According to the configuration, the heat received by the bag from the outside is transferred to the working fluid via the bag. The working fluid is vaporized due to the heat that is transferred. The working fluid in the gas phase absorbs the heat of vaporization. The working fluid in the gas phase moves inside the bag to the side edge portion of the bag at which the contact component is disposed. The bag expands when the working fluid is vaporized and the side edge portion contacts the contact component. The heat is transferred to the contact component via the side edge portion of the bag and thus the working fluid in the gas phase is vaporized and the phase of the working fluid changes to the liquid phase. The heat absorbed as the heat of vaporization is transferred to the contact component. The heat is transferred from the bag to the contact component as described above.

In the above configuration, the spacer is disposed between the first contact portion and the second contact portion of the contact component. By adjusting a distance between the first contact portion and the second contact portion with the spacer, an excessive amount of pressure is less likely to be applied to the bag. Therefore, a sufficient space can be provided for the working fluid in the gas phase to move in the side edge portion of the bag. The heat is transferred from the working fluid in the gas phase to the bag. Therefore, the heat transfer efficiency of the heat transfer device improves.

By adjusting the distance between the first contact portion and the second contact portion with the spacer, the pressure applied to the bag is less likely to be excessively reduced. Even if the bag expands due to the vaporization of the working fluid, the side edge portion of the bag sufficiently contacts the contact component. According to the configuration, the heat is transferred from the bag to the contact portion via the side edge portion. Therefore, the heat transfer efficiency of the heat transfer device improves.

Following embodiments may be included in preferred embodiments of the technology described herein.

The first contact portion may include a first through hole. The second contact portion may include a second through hole. The spacer may include a third through hole. The first contact portion and the second contact portion may be fastened with a fastener that includes a shank passed through the first through hole, the second through hole, and the third through hole.

According to the configuration, the first contact portion, the second contact portion, and the spacer are fixed while relative movement is restricted by the shank of the fastener. According to the configuration, the side edge portion of the bag properly contacts the first contact portion and the second contact portion. Therefore, the heat transfer efficiency of the heat transfer device further improves.

The side edge portion of the bag may include a recess at a location corresponding to the spacer so that the side edge portion may not become an obstacle to the spacer.

According to the configuration, a section of the side edge portion of the bag expandable due to the vaporization of the working fluid can be increased. A larger amount of the working fluid in the gas phase moves to the side edge portion of the bag. Therefore, the heat transfer efficiency of the heat transfer device improves.

A heat transfer system described herein includes the heat transfer device described above and a jacket thermally connected to the heat transfer device and including a heat medium inside the jacket.

According to the configuration, the heat is transferred from the heat transfer device to the jacket and then to the heat medium inside the jacket. By circulating the heat medium, the heat is further transferred. Therefore, the heat is less likely to remain in the heat transfer device. According to the configuration, the heat transfer efficiency of the heat transfer device further improves.

An energy storage module described herein includes a heat transfer system described above and an energy storage component contacting the bag of the heat transfer device.

According to the configuration, the heat generated in the energy storage component during charge and discharge is efficiently transferred and released to the outside. Therefore, performance of the energy storage component improves.

If the performance of the energy storage component cannot be achieved at a sufficient level due to a low temperature of the energy storage component, the heat may be applied to the heat medium. The heat is transferred from the heat medium to the jacket, the contact component, the side edge portion of the bag, and the working fluid in this sequence. The heat is then transferred from the working fluid to the energy storage component via the bag. According to the configuration, the performance of the energy storage component improves.

According to the technology described herein, the heat transfer efficiency of the heat transfer device improves.

BRIEF DESCRIPTION OF THE DRAWINGS

FIG. 5 is a cross-sectional view along line V-V in FIG. 3.

MODES FOR CARRYING OUT THE INVENTION

First Embodiment

An energy storage module 10 to which the technology described herein is applied will be described with reference to FIGS. 1 to 5. The energy storage module 10 may be installed in a vehicle such as an electric vehicle and a hybrid vehicle and configured to supply power to a load such as a motor. Although the energy storage module 10 can be set in any position, the energy storage module 10 will be described with sides pointed by an X arrow, a Y arrow, and a Z arrow referred to as a left side, a front side, and an upper side, respectively. One of components having the same configuration may be indicated by a reference sign and others may not be indicated by the reference sign.

Energy Storage Module 10

Figure 1:
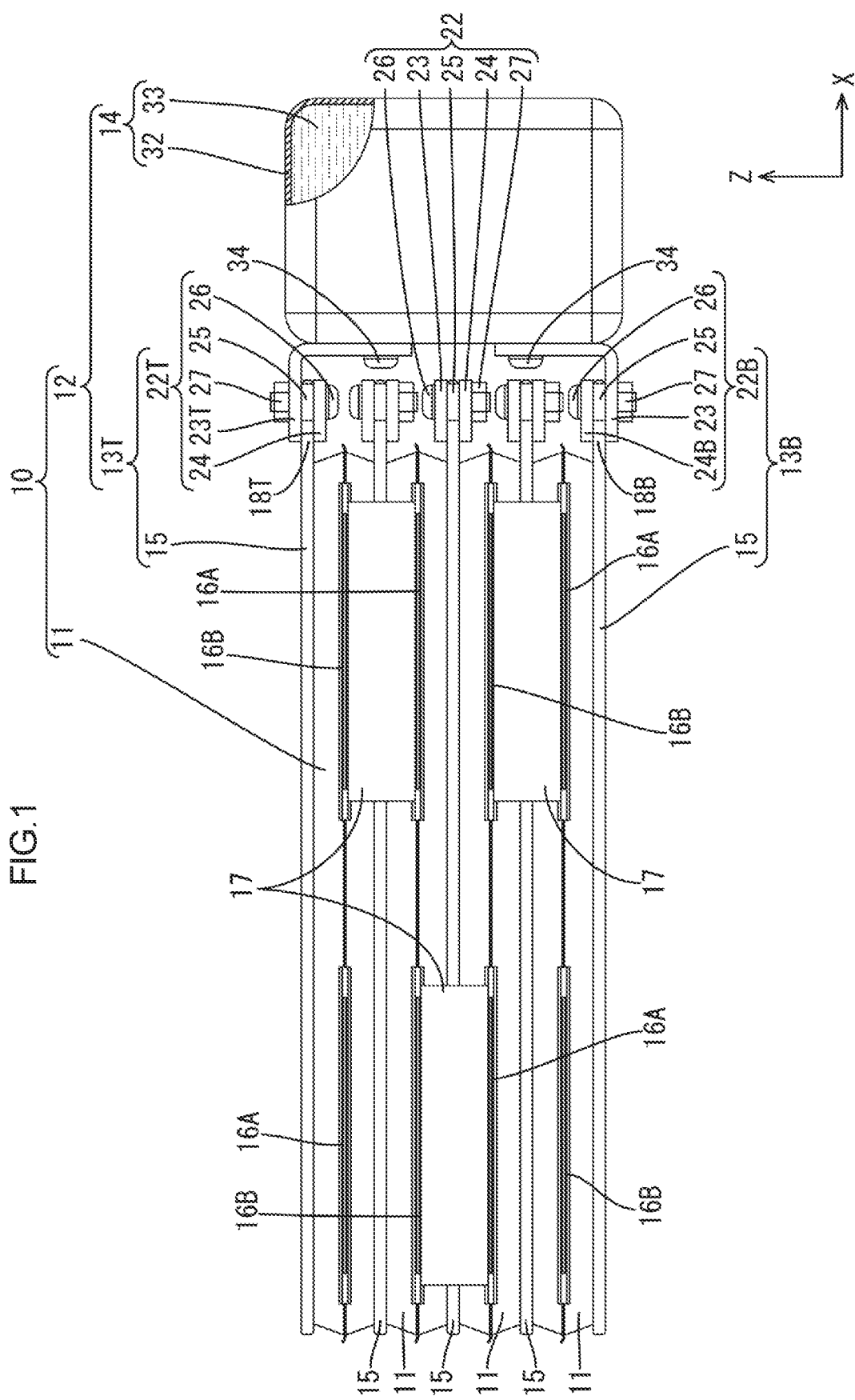
FIG. 1 is a side views of an energy storage module according to a first embodiment.

As illustrated in FIG. 1, the energy storage module 10 includes multiple (four in this embodiment) energy storage components 11 and a heat transfer system 12. The heat transfer system 12 includes multiple (five in this embodiment) heat transfer devices 13 and a jacket 14 thermally connected to the heat transfer devices 13.

Energy Storage Component 11

Figure 2:
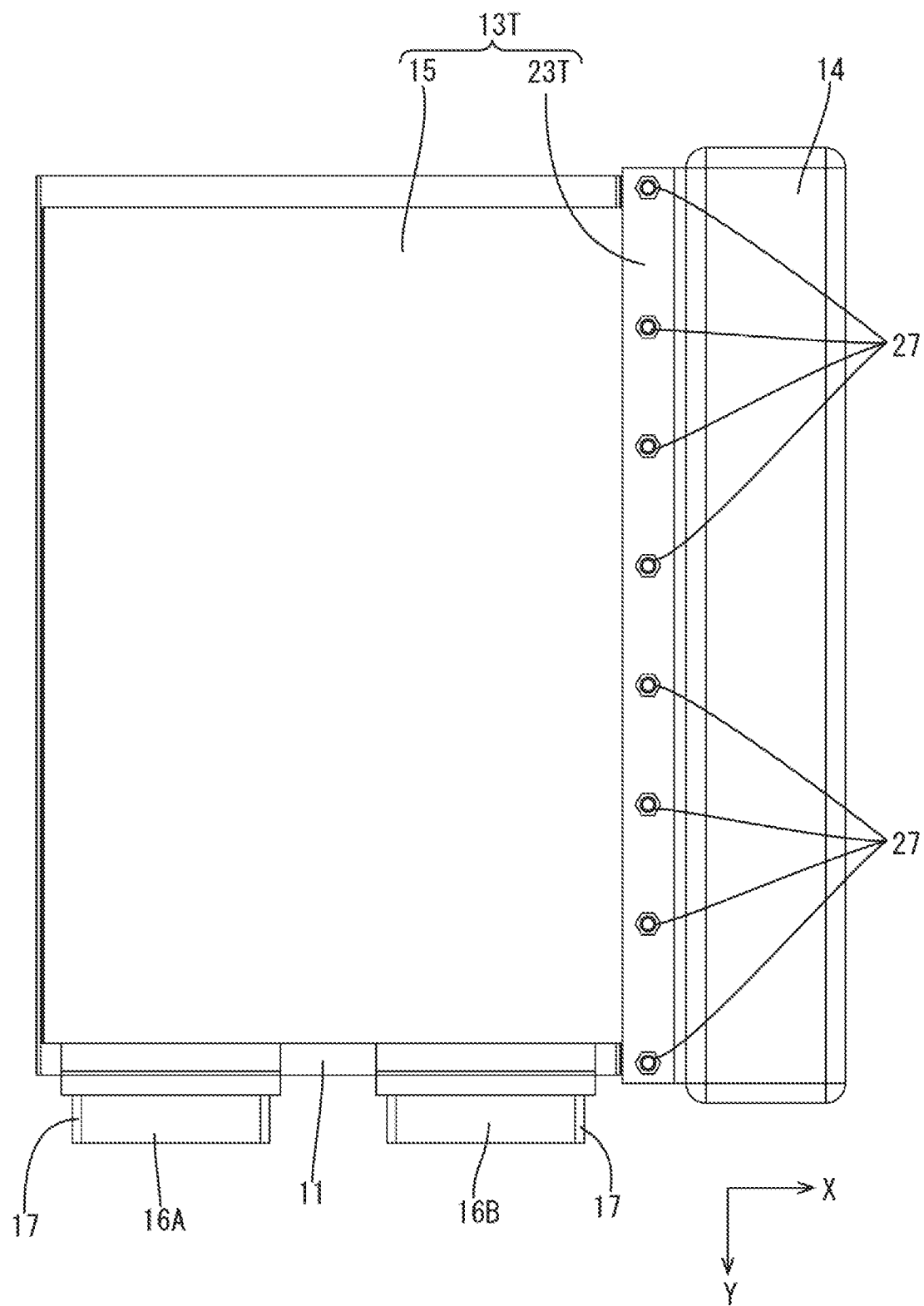
FIG. 2 is a plan view of the energy storage module.

The energy storage components 11 include energy storage elements, which are not illustrate, liquid-tightly enclosed in bags 15 prepared from laminate sheets. As illustrated in FIG. 2, positive electrodes 16A and negative electrodes 16B project from front edges of the energy storage components 11. The positive electrodes 16A and the negative electrodes 16B project from the inside of the laminate sheets to the outside with liquid-tightness with inner surfaces of the laminate sheets. Each of the positive electrodes 16A and the negative electrodes 16B has a metal foil shape. The positive electrodes 16A and the negative electrodes 16B may be referred to as the electrodes 16 to describe them without distinction. The electrodes 16A and 16B of each energy storage component 11 are disposed with a gap therebetween and electrically connected to the energy storage element inside the energy storage component 11.

As illustrated in FIG. 1, the energy storage components 11 are stacked in the top-bottom direction such that each electrode 16A is adjacent to another electrode 16B. The adjacent electrodes 16A and 16B are electrically connected to each other via U-shaped conductive members 17 (three connecting members 17 in this embodiment). The electrodes 16A and 16B and the conductive members 17 are connected by a known method such as laser welding, ultrasonic welding, and brazing. By connecting the adjacent electrodes 16A and 16B via the respective conductive members 17, the energy storage components 11 are connected in series.

In this embodiment, secondary batteries such as lithium-ion secondary batteries and nickel-metal hydride secondary batteries may be used for the energy storage components 11. Alternatively, capacitors such as electric double layer capacitors and lithium-ion capacitors may be used. Any types of energy storage components may be used where appropriate.

Heat Transfer Device 13

Each energy storage component 11 is disposed between adjacent heat transfer devices 13. Each heat transfer device 13 has a rectangular shape when viewed from above. A dimension of each heat transfer device 13 in the front-rear direction is smaller than a dimension of each energy storage component 11 in the front-rear direction. A dimension of the heat transfer device in the right-left direction is slightly larger than a dimension of the energy storage component 11 in the right-left direction. Left edge portions 18 (an example of a side edge portion) of the heat transfer devices 13 that are stacked together with the energy storage components 11 in the top-bottom direction project from left edge portions of the energy storage components 11 toward the left.

Figure 3:
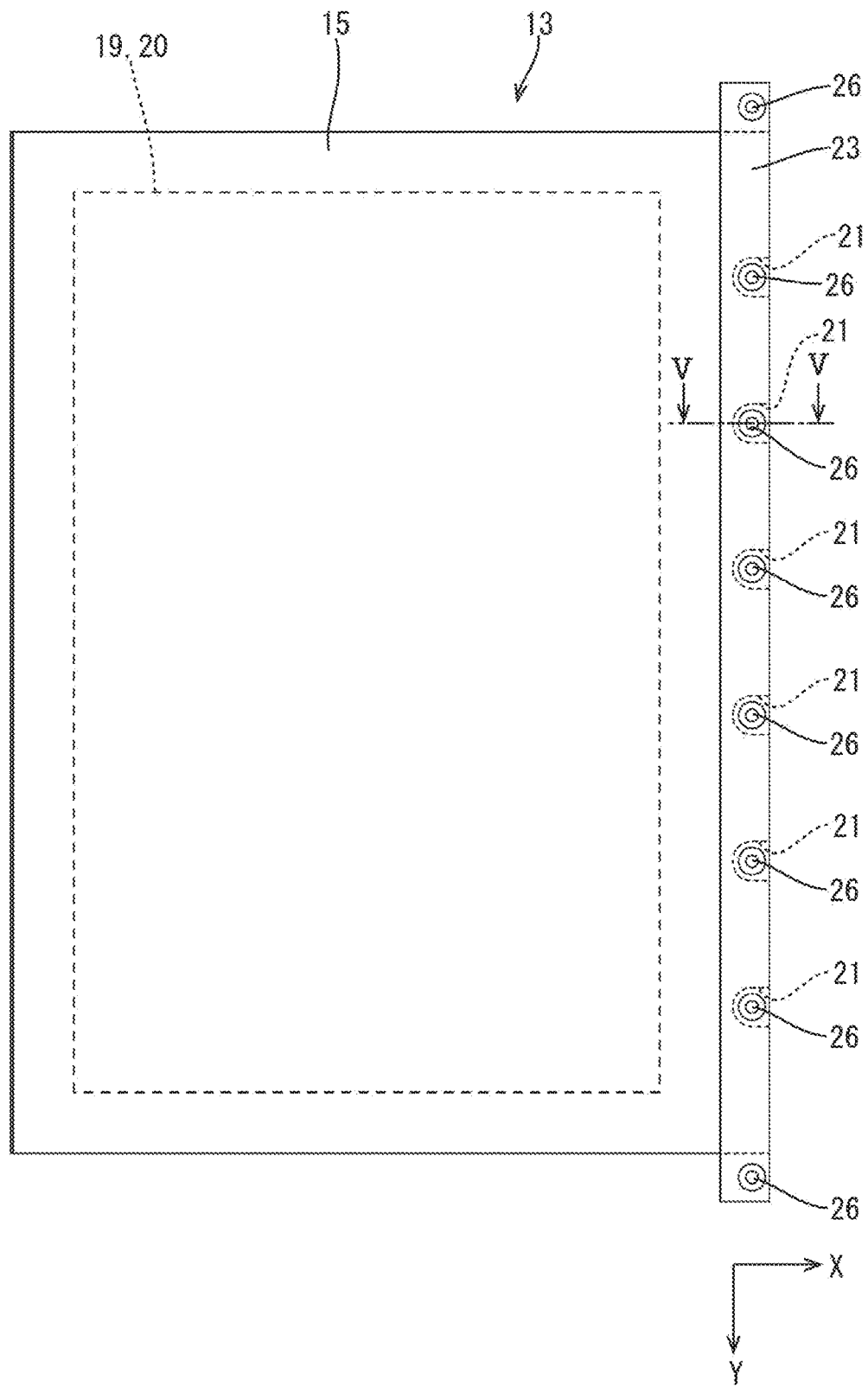
FIG. 3 is a plan view of a heat transfer device.

The heat transfer devices 13 include the working 19 and absorbing members 20. The working fluids 19 change their phases between liquid and gas. The absorbing members 20 absorb the working fluids 19. Inside the bags 15, the working fluids 19 may be absorbed by the absorbing members 20 or some of the working fluids 19 may be absorbed by the absorbing members 20 and the rest of the working fluids 19 may be present in spaces between the absorbing members 20 and the bags 15. Amounts of the working fluids 19 enclosed in the bags 15 may be defined where appropriate. In FIG. 3, the reference sign indicating the working fluid 19 indicates the absorbing member 20 to express that the working fluid 19 absorbed by the absorbing member 20 exists in the absorbing member 20.

The working fluids 19 may be selected from one of or some of perfluorocarbon, perfluoroketone, hydrofluoroether, hydrofluoroketone, fluorine inert fluid, water, and alcohol. The alcohol may be methanol or ethanol. The working fluids 19 may have insulating properties or conductivity.

Each absorbing member 20 has a rectangular sheet shape. The absorbing members 20 are made of a material that is capable of absorbing the working fluids 19. The absorbing members 20 may be prepared by weaving fibers made of the material that is capable of absorbing the working fluids 19 or from non-woven cloth. The nonwoven fabric may be in the form of a fabric sheet, a web (a thin film consists of only fibers), or a batt (fibers put together into the form of blanket). The material of the absorbing members 20 may be a natural fiber material, a synthetic fiber material including a synthetic resin, or a combination of the natural fiber material and the synthetic fiber material.

Each bag 15 may be prepared by liquid-tightly binding two sheets together by a known method such as bonding and welding. Each sheet may have a rectangular shape. Each sheet includes a metal sheet and synthetic resin films that are placed on surfaces of the metal sheet and laminated. A metal used for the metal sheet may be aluminum, aluminum alloy, copper, or copper alloy selected where appropriate. A synthetic resin used for the synthetic resin film may be selected from any synthetic resins including polyolefin such as polyethylene and polypropylene, polyester such as polybutylene terephthalate and polyethylene terephthalate, and polyamide such as nylon 6 and nylon 6,6 where appropriate. Each bag 15 in this embodiment is prepared by placing the sheets such that surfaces covered with the synthetic films are on top of each other and bonding them together by thermal fusion bonding.

As illustrated in FIG. 3, the left edge portion 18 of each bag 15 includes recesses 21 (six recesses in this embodiment) arranged at intervals in the front-rear direction. Each recess 21 has a U shape with an opening on the left side when viewed from above.

Contact Component 22

Figure 4:
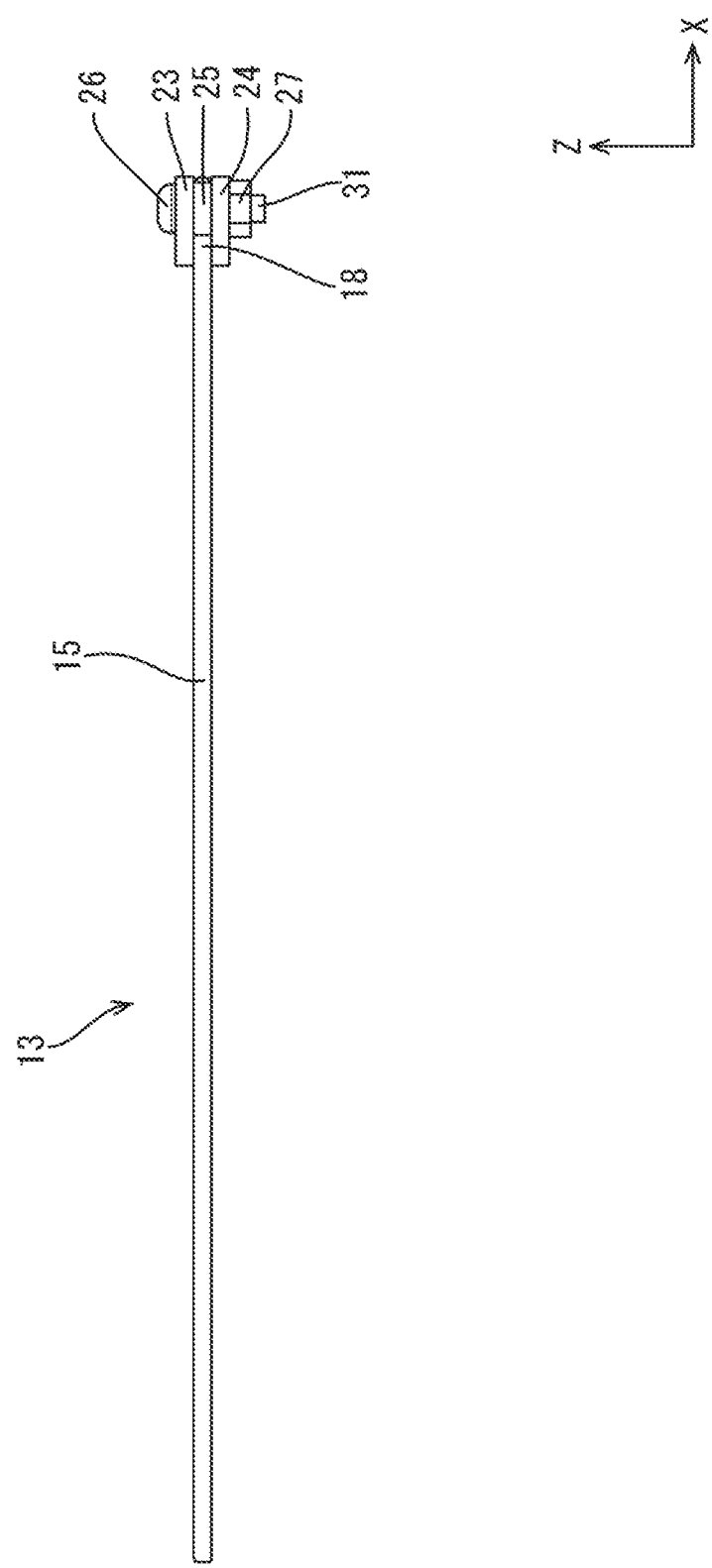
FIG. 4 is a side view of the heat transfer device.

As illustrated in FIGS. 3 and 4, the contact components 22 are attached to the left edge portions 18 of the bags 15, respectively. The contact components 22 include first contact portions 23, second contact portions 24, and spacers 25. The first contact portions 23 and the second contact portions 24 are prepared by pressing metal plates into predefined shapes. Multiple (eight in this embodiment) spacers 25 are disposed between the first contact portions 23 and the second contact portions 24. The first contact portion 23, the second contact portion 24, and the spacer 25 of each contact component 22 are fixed with a bolt 26 and a nut 27 (an example of a fastener). The bolt 26 penetrates the first contact portion 23, the second contact portion 24, and the spacer 25. The nut 27 is threaded onto the bolt 26.

The first contact portions 23 and the second contact portions 24 are prepared by pressing the metal plates. The first contact portions 23 and the second contact portions 24 have elongated plate shapes that extend in the front-rear direction. Each first contact portion 23 includes multiple (eight in this embodiment) first through holes 28 arranged at intervals in the front-rear direction. Each first through hole 28 opens in the top-bottom direction. Each second contact portion 24 includes multiple (eight in this embodiment) second through holes 29 arranged at intervals in the front-rear direction. Each second through hole 29 opens in the top-bottom direction.

The spacers 25 are made of metal. Each spacer 25 has a tubular shape. The spacers 25 include third through holes 30 that extend in the top-bottom direction. By adjusting a dimension of each spacer 25 in the top-bottom direction where appropriate, a gap between the first contact portion 23 and the second contact portion 24 of each contact component 22 in the top-bottom direction can be adjusted.

As illustrated in FIG. 5, the spacer 25 is disposed between the first contact portion 23 and the second contact portion 24 such that the first through hole 28, the second through hole 29, and the third through hole 30 correspond to one another. A shank 31 of the bolt 26 is passed through the first through hole 28, the second through hole 29, and the third through hole 30. The bolt 26 and the nut 27 are fastened together. As a result, the first contact portion 23 and the second contact portion 24 are fixed with a gap therebetween.

An outer diameter of each spacer 25 is defined smaller than an inner diameter of each recess 21 in the heat transfer devices 13. Therefore, the spacers 25 can be placed in the corresponding recesses 21 with the inner side edges of the recesses 21 separated from the spacers 25.

Jacket 14

As illustrated in FIGS. 1 and 2, the jacket 14 is disposed on the left of the stacked energy storage components 11. The jacket 14 includes a metal case 32 and a liquid heat medium 33 that is held inside the case 32. The jacket 14 includes an inlet and an outlet, which are not illustrated. The heat medium is drawn into the jacket 14 through the inlet and drawn out of the jacket 14 through the outlet. According to the configuration, the heat medium 33 circulates inside the jacket 14. Heat transferred to the heat medium 33 via the case 32 of the jacket 14 is released to the outside of the jacket 14 by the heat medium 33. The heat medium 33 may be water, oil, or antifreeze solution selected where appropriate.

A left edge of the second contact portion 24B attached to the left edge portion 18B of the heat transfer device 13B at the bottom project from the left edge of the first contact portion 23 toward the left and bends upward at the right angle. The left edge is fixed to the right sidewall of the jacket 14 with a bolt 34. According to the configuration, the second contact portion 24B of the contact component 22 of the heat transfer device 13B at the bottom is thermally connected to the jacket 14.

The left edge of the first contact portion 23T attached to the left edge portion 18T of the heat transfer device 13T at the top project from the left edge of the second contact portion 24 toward the left and bends downward at the right angle. The left edge is fixed to the right sidewall of the jacket 14 with the bolt 34. According to the configuration, the contact component 22T of the heat transfer device 13T at the top is thermally connected to the jacket 14. In the heat transfer device 13T at the top in this embodiment, a head of the bolt 26 is located on a lower side and the nut 27 is located on a lower side. However, the heat transfer device 13T may be configured such that the heat of the bolt 26 is located on the upper side and the nut 27 is located on the lower side, similar to other heat transfer devices 13.

Example or Assembly Process Energy Storage Module 10

Next, an example of an assembly process of the energy storage module 10 according to this embodiment will be described. The assembly process of the energy storage module 10 is not limited to the process described below.

Three side edges of the rectangular sheets are welded to prepare the bag 15 with an opening on one side. The absorbing member 20 and the working fluid 19 are inserted in the bag 15. Then, the edges of the opening are welded to seal the bag 15.

The recessed 21 are formed at intervals in the left edge portion 18 of the bag 15 by punching.

The first through holes 28 in the first contact portion 23, the corresponding second through holes 29 in the second contact portion 24, and the third through holes 30 in the corresponding spacers 25 are aligned and the bolts 26 are inserted. The spacers 25 are inserted in the corresponding recesses 21 and the contact components 22 are fixed to the left edge portions 18 of the bags 15 with bolts 26 and nuts 27. Through these steps, the heat transfer devices 13 are complete.

Then, the energy storage components 11 and the heat transfer devices 13 are stacked in the top-bottom direction with the energy storage components A1 placed between the heat transfer devices 13. The second contact portion 24B of the heat transfer device 13B at the bottom is fixed to the jacket 14 with the bolt 34. The first contact portion 23T of the heat transfer device 13T at the top is fixed to the jacket 14 with the bolt 34. Through these steps, the energy storage module 10 and the heat transfer system 12 are complete.

Effect of This Embodiment

Next, effect of this embodiment will be described. Each heat transfer device 13 according to this embodiment includes the sealed bag 15, the working fluid 19, and the contact component 22. The working fluid 19 is enclosed in the bag 15. The contact component 22 includes the first contact portion 23 and the second contact portion 24 that are separated from each other via the spacer 25. The left edge portion 18 of the bag 15 is disposed between the first contact portion 23 and the second contact portion 24. When the bag 15 expands due to the vaporization of the working fluid 19, the left edge portion 18 contacts the first contact portion 23 and the second contact portion 24.

According to the configuration, when the bag 15 receives heat from the outside, the heat is transferred to the working fluid 19 via the bag 15. The working fluid 19 vaporizes due to the heat that is transferred. The working fluid 19 in the gas phase absorbs the heat of vaporization. The working fluid 19 in the gas phase moves inside the bag 15 to the left edge portion 18 of the bag 15 at which the contact component is disposed. As the working fluid 19 vaporizes, the bag 15 expands and thus the left edge portion 18 contacts the contact component 22. When the heat is transferred to the contact component 22 via the left edge portion 18 of the bag 15 and the working fluid 19 in the gas phase is condensed, the phase of the working fluid 19 changes to the liquid phase. The absorbed heat of vaporization is transferred to the contact component 22. The heat is transferred from the bag 15 to the contact component 22 as described above.

In the configuration, the spacers 25 are disposed between the first contact portion 23 and the second contact portion 24 of each contact component 22. The distance between the first contact portion 23 and the second contact portion 24 may be adjusted with the spacers 25 to reduce the excessive pressure that may be applied to the bag 15. According to the configuration, a sufficient space is provided in the left edge portion 18 of the bag 15 for the working fluid 19 in the gas phase to move. The heat can be transferred from the working fluid 19 in the gas phase to the bag 15. Therefore, the heat transfer efficiency of the heat transfer device 13 improves.

By adjusting the distance between the first contact portion 23 and the second contact portion 24 with the spacers 25, the pressure applied to the bag 15 is less likely to be excessively small. Even if the bag 15 expands due to the vaporization of the working fluid 19, the heat is transferred from the bag 15 to the contact component 22 via the left edge portion 18. Therefore, the heat transfer efficiency of the heat transfer device 13 improves.

In this embodiment, each first contact portion 23 includes the first through holes 28, each second contact portion 24 includes the second through holes 29, and the spacers 25 include the third through holes 30. The first contact portion 23 and the second contact portion 24 are fastened with the bolts 26 that include shanks 31 passed through the respective first through holes 28, the respective second through holes 29, and the respective third through holes 30.

In the above configuration, the first contact portion 23, the second contact portion 24, and the spacers 25 are fixed and thus relative movement does not occur due to the shanks 31 of the bolts 26. According to the configuration, the left edge of the bag 15 properly contacts the first contact portion 23 and the second contact portion 24. Therefore, the heat transfer efficiency of the heat transfer device 13 further improves.

In this embodiment, the left edge portion 18 of each bag 15 includes the recesses 21 at the locations corresponding to the spacers 25 so that the left edge portion 18 is less likely to become an obstacle to the spacers 25.

According to the configuration, a section to be expandable due to the vaporization of the working fluid 19 can be increased at the left edge portion 18 of the bag 15. A larger amount of the working fluid 19 in the gas phase moves to the left edge portion 18 of the bag 15. Therefore, the heat transfer efficiency of the heat transfer device 13 improves.

The heat transfer system 12 according to this embodiment includes the heat transfer devices 13 and the jacket thermally connected to the contact components 22. The jacket 14 includes the heat medium 33 inside.

According to the configuration, the heat is transferred from the heat transfer devices 13 to the jacket 14 and then to the heat medium 33 inside the jacket 14. By circulating the heat medium 33, the heat is transferred. Therefore, the heat is less likely to remain in the heat transfer devices 13 and thus the heat transfer efficiency of the heat transfer devices 13 further improves.

In this embodiment, the contact component 22B of the heat transfer device 13B at the bottom and the contact component 22T of the heat transfer device 13T at the top are thermally connected to the jacket 14. According to the configuration, the heat generated in the energy storage component 11 at the bottom is transferred to the jacket 14 and the heat generated in the energy storage component 11 at the top is transferred to the jacket 14.

The energy storage module 10 according to this embodiment includes the heat transfer system 12 and the energy storage components 11 that contact the bags 15 of the heat transfer devices 13.

According to the configuration, the heat generated in the energy storage components 11 during charge and discharge efficiently transferred and released to the outside. Therefore, performance of the energy storage components 11 improves.

If performance of the energy storage components 11 cannot be achieved at a sufficient level due to low temperatures of the energy storage components 11, the heat may be applied to the heat medium 33. The heat is transferred from the heat medium 33 to the jacket 14, the contact components 22, the left edge portions 18 of the bags 15, and the working fluids 19 in this sequence. The heat is then transferred from the working fluids 19 to the energy storage components 11 via the bags 15. According to the configuration, the performance of the energy storage components 11 improves.

Other Embodiments

The technology described herein is not limited to the embodiments described above and illustrated in the drawings. For example, the following embodiments will be included in the technical scope of the technology described herein.

(1) In the above embodiment, the bolts 26 and the nuts 27 are used for the fasteners. However, rivets may be used to fasten the first contact portions 23 and the second contact portions 24. The first contact portions 23 and the second contact portion 24 may be fastened to the spacers 25 by a known method such as welding, brazing, and soldering.

(2) In the above embodiment, each contact component 22 includes eight spacers 25. However, each contact component 22 may include one, two, three, four, five, six, seven, nine, or more than nine contact spacers 25. The shape of each spacer 25 is not limited to the tubular shape. The shape may be a polygonal tube shape such as a rectangular tube shape such as a prism-shaped tube shape.

(3) The heat transfer devices 13 and the heat transfer system 12 according to this embodiment are applied to the energy storage module 10. However, the heat transfer devices 13 and the heat transfer system 12 may be applied to components that generate heat when conducted such as switching components, bus bars, electric junction boxes, and electronic control units (ECUs).

(4) In the above embodiment, the contact components 22 are thermally connected to the jacket 14. However, the contact components 22 may be thermally connected to a heatsink, a heat pipe, or a Peltier device.

(5) The energy storage module 10 according to the above embodiment includes four energy storage components 11. However, the energy storage module 10 may include one, two, three, five, or more than five energy storage components 11.

(6) In the above embodiment, the contact components 22 are attached to the left edge portions 18 of the bags 15. However, the contact components 22 may be any edges of the bags 15. The contact components 22 may be multiple edges of each bag 15.

(7) in the above embodiment, the bags 15 include the recesses 21. However, the bags 15 may not include the recesses 21.

EXPLANATION OF SYMBOLS

10: Energy storage module
11: Energy storage component
12: Heat transfer system
13, 13B, 13T: Heat transfer device
14: Jacket
15: Bag
18, 18B, 18T: Left edge portion
19: Working fluid
21: Recess
22, 22B, 22T: Contact component
23, 23T: First contact portion
24, 24B: Second contact portion
25: Spacer
26: Bolt
27: Nut
28: First through hole
29: Second through hole
30: Third through hole
31: Shank
33: Heat medium

The invention claimed is:

1. A heat transfer device comprising:
a sealed bag;
a working fluid enclosed in the bag; and
a contact component including a first contact portion and a second contact portion that are to transfer heat from the bag and that are separated from each other via a spacer that is not exposed to the working fluid, wherein
at least one side edge portion of the bag is disposed between the first contact portion and the second contact portion, and
the at least one side edge portion contacts the first contact portion and the second contact portion when the bag expands due to vaporization of the working fluid.

2. The heat transfer device according to claim 1, wherein
the first contact portion includes a first through hole,
the second contact portion includes a second through hole,
the spacer includes a third through hole, and
the first contact portion and the second contact portion are fastened with a fastener that includes a shank passed through the first through hole, the second through hole, and the third through hole.

3. The heat transfer device according to claim 1, wherein the side edge portion of the bag includes a recess at a location corresponding to the spacer so that the side edge portion is not to be an obstacle to the spacer.

4. A heat transfer system comprising:
the heat transfer device according to claim 1; and
a jacket thermally connected to the heat transfer device and including a heat medium inside the jacket.

5. An energy storage module comprising:
a heat transfer system according to claim 4; and
an energy storage component contacting the bag of the heat transfer device.

6. The heat transfer device according to claim 1, wherein the spacer is removably disposed between the first contact portion and the second contact portion to provide an adjustable separation distance between the first contact portion and the second contact portion.

7. The heat transfer device according to claim 1, wherein an entirety of the spacer is disposed between the first contact portion and the second contact portion.

8. The heat transfer device according to claim 2, wherein the fastener is not exposed to the working fluid.

9. The heat transfer system according to claim 4, wherein the jacket is disposed outside of the bag, and one of the first contact portion and the second contact portion is fixed to the jacket.

* * * * *